(12) United States Patent
Hsiao et al.

(10) Patent No.: US 11,694,001 B2
(45) Date of Patent: Jul. 4, 2023

(54) METHOD FOR ANALYZING ELECTROMAGNETIC CHARACTERISTIC AND ELECTRONIC DEVICE

(71) Applicant: Wistron NeWeb Corporation, Hsinchu (TW)

(72) Inventors: An-Ting Hsiao, Hsinchu (TW); Shun-Chung Kuo, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 415 days.

(21) Appl. No.: 17/135,132

(22) Filed: Dec. 28, 2020

(65) Prior Publication Data
US 2021/0279380 A1    Sep. 9, 2021

(30) Foreign Application Priority Data
Mar. 3, 2020  (TW) .................................. 109106962

(51) Int. Cl.
*G06F 30/20* (2020.01)
*H02J 50/00* (2016.01)

(52) U.S. Cl.
CPC .............. *G06F 30/20* (2020.01); *H02J 50/00* (2016.02)

(58) Field of Classification Search
CPC ................................ G06F 30/20; H02J 50/00
See application file for complete search history.

(56) References Cited

U.S. PATENT DOCUMENTS

2020/0096547 A1*  3/2020  Orozco Valdes .... H04B 17/101

* cited by examiner

*Primary Examiner* — Chuen-Meei Gan
(74) *Attorney, Agent, or Firm* — McClure, Qualey & Rodack, LLP

(57) ABSTRACT

A method for analyzing electromagnetic characteristic includes steps as follows. An electromagnetic evaluation model establishing step is performed, which includes establishing an object unit, a power transmitting unit, and a simulating unit. The object unit is an arbitrary geometry shape. The power transmitting unit has an electromagnetic signal. The simulating unit is defined as at least one base point emitting a plurality of beams to form a plurality of projection points. An electromagnetic reference model is provided, wherein the object unit and the power transmitting unit are combined to form the electromagnetic reference model. A comparing step is performed, wherein a radiation pattern data of the electromagnetic reference model and a radiation pattern data of the electromagnetic evaluation model are obtained by the electromagnetic signal, respectively, and the two radiation pattern data are compared to obtain an electromagnetic gain difference value.

19 Claims, 12 Drawing Sheets

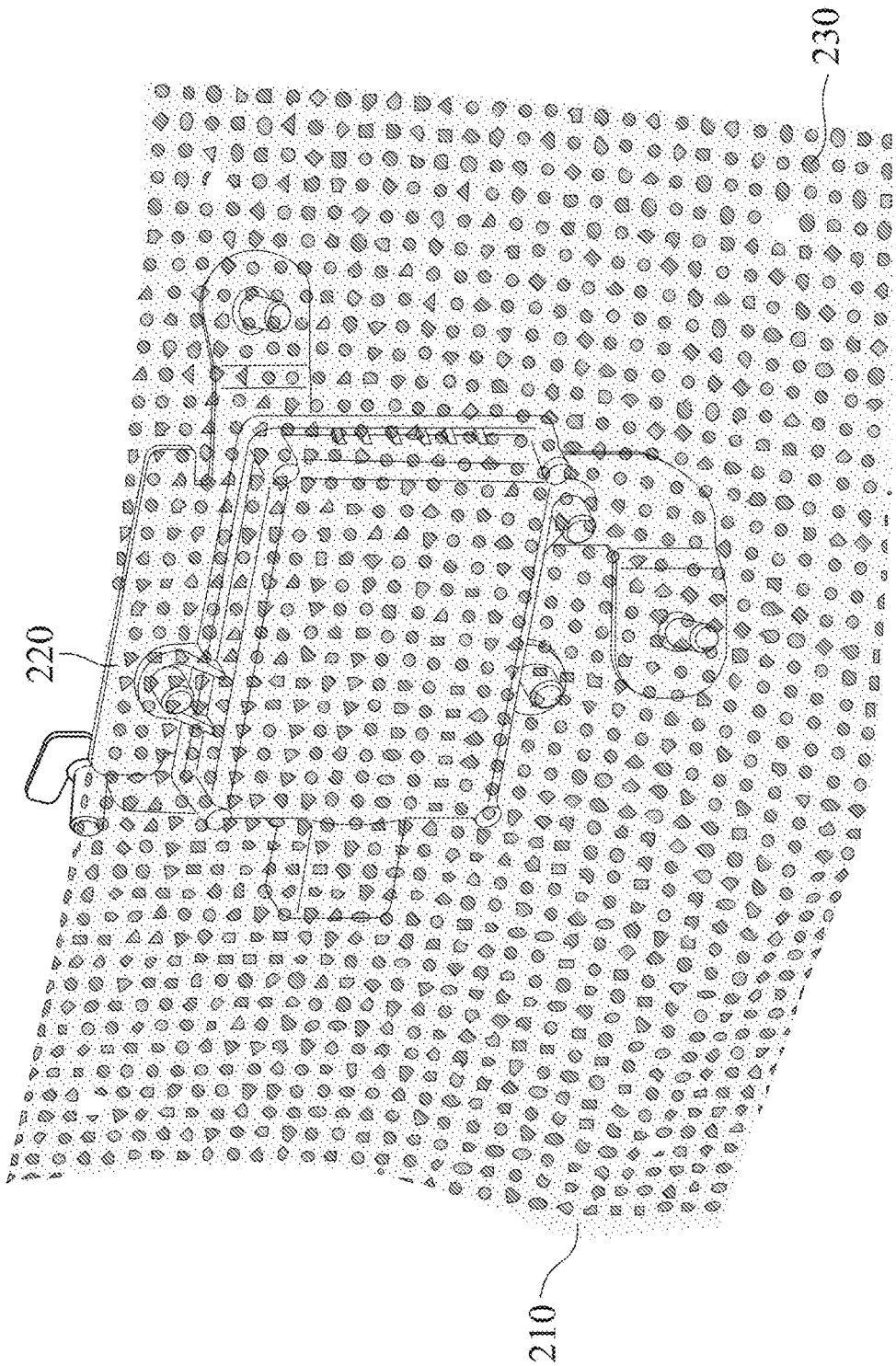

METHOD FOR ANALYZING ELECTROMAGNETIC CHARACTERISTIC AND ELECTRONIC DEVICE

RELATED APPLICATIONS

This application claims priority to Taiwan Application Serial Number 109106962, filed Mar. 3, 2020, which is herein incorporated by reference.

BACKGROUND

Technical Field

The present disclosure relates to a method for analyzing electromagnetic characteristic and an electronic device. More particularly, the present disclosure relates to a method for analyzing electromagnetic characteristic and an electronic device which are for simulating the object containing metal coating.

Description of Related Art

In recent years, the vehicles are often equipped with the wireless communication devices, such as the global positioning systems, the digital televisions, the radios, etc., and these wireless communication devices are needed to rely on the vehicle antennas to receive or transmit the wireless signals for ranging, exchanging information and other applications.

The vehicle antenna is usually installed at the vehicle bumper, but the paint containing metal component in the vehicle bumper will affect the characteristic of the vehicle antenna, causing the characteristic attenuation or generating the false alarm. Therefore, the impact of the paint containing metal component on the antenna in the vehicle bumper should be evaluated in advance. However, the commonly used electromagnetic simulation software lacks the setting of the metal dust effect, so that the corresponding simulation cannot be performed.

Therefore, how to improve the defect of the electromagnetic simulation software and evaluate the impact between the object containing metal component and the antenna effectively to achieve the more accurate simulation prediction.

SUMMARY

According to one aspect of the present disclosure, a method for analyzing electromagnetic characteristic is used to analyze an electromagnetic characteristic of an object collocating with a power transmitting element. The method for analyzing electromagnetic characteristic includes steps as follows. An electromagnetic evaluation model establishing step is performed, wherein the electromagnetic evaluation model establishing step includes establishing an object unit, a power transmitting unit, and a simulating unit. The object unit is an arbitrary geometry shape, and the object unit has an object information. The power transmitting unit has an electromagnetic signal. The simulating unit is defined as at least one base point emitting a plurality of beams to form a plurality of projection points, and the projection points are used to simulate a plurality of metal dusts on the object unit. The object unit, the power transmitting unit and the simulating unit are combined to form an electromagnetic evaluation model, a projection point coverage rate of the electromagnetic evaluation model is obtained according to the object information and a sum of areas of the projection points, and the projection point coverage rate is a metal coverage rate of the metal dusts on the object unit. An electromagnetic reference model is provided, wherein the object unit and the power transmitting unit are combined to form the electromagnetic reference model. A comparing step is performed, wherein a radiation pattern data of the electromagnetic reference model and a radiation pattern data of the electromagnetic evaluation model are obtained by the electromagnetic signal, respectively, and the two radiation pattern data are compared to obtain an electromagnetic gain difference value.

According to another aspect of the present disclosure, an electronic device is provided. The electronic device includes a memory and a processor. The memory stores an electromagnetic characteristic evaluation program. The processor is coupled to the memory for executing the electromagnetic characteristic evaluation program. The electromagnetic characteristic evaluation program includes an electromagnetic evaluation model established module, an electromagnetic reference model established module and a comparing module. The electromagnetic evaluation model established module includes an object unit, a power transmitting unit and a simulating unit. The object unit is an arbitrary geometry shape, and the object unit has an object information. The power transmitting unit has an electromagnetic signal. The simulating unit is defined as at least one base point emitting a plurality of beams to form a plurality of projection points, and the projection points are used to simulate a plurality of metal dusts on the object unit. The object unit, the power transmitting unit and the simulating unit are combined to form an electromagnetic evaluation model, a projection point coverage rate of the electromagnetic evaluation model is obtained according to the object information and a sum of areas of the projection points, and the projection point coverage rate is a metal coverage rate of the metal dusts on the object unit. The electromagnetic reference model established module is for combining the object unit and the power transmitting unit to obtain an electromagnetic reference model. A radiation pattern data of the electromagnetic reference model and a radiation pattern data of the electromagnetic evaluation model are obtained by the electromagnetic signal, respectively, and the two radiation pattern data are compared to obtain an electromagnetic gain difference value.

BRIEF DESCRIPTION OF THE DRAWINGS

The present disclosure can be more fully understood by reading the following detailed description of the embodiment, with reference made to the accompanying drawings as follows:

FIG. 2A is a schematic diagram of the electromagnetic evaluation model according to Example 1 of the present disclosure.

DETAILED DESCRIPTION

Figure 1:
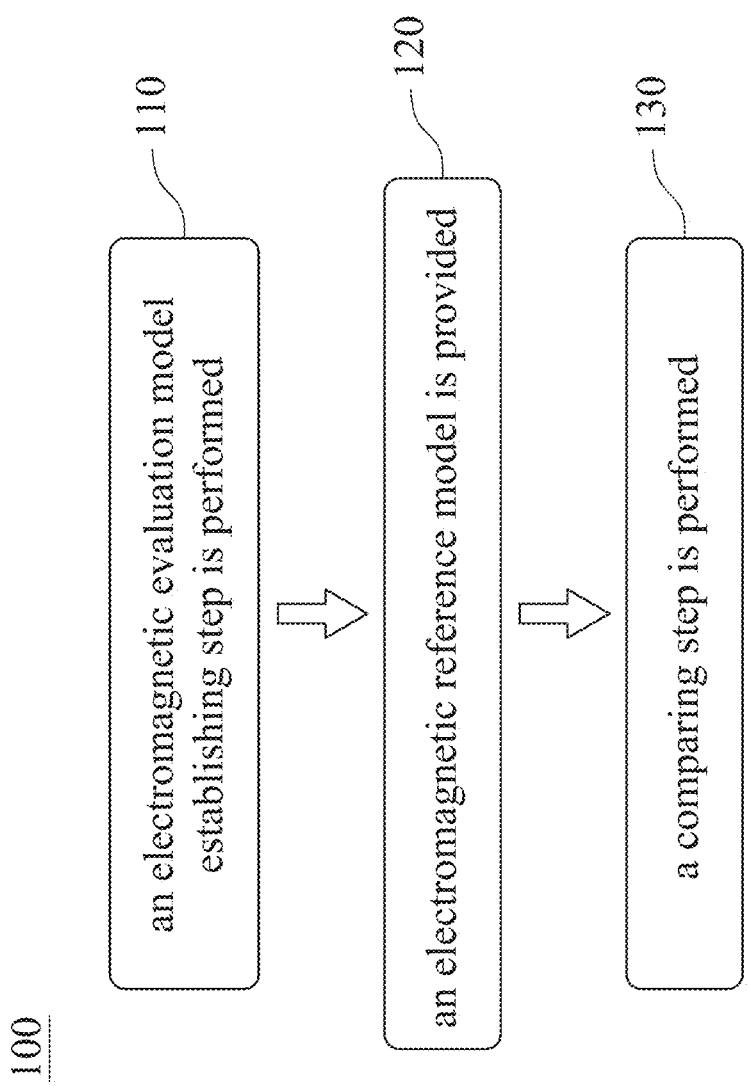
FIG. 1 is a flow chart of a method for analyzing electromagnetic characteristic according to one embodiment of the present disclosure.

The embodiments of the present disclosure will be described below by referring the figures. For the clarity, many practical details will be explained in the following description. However, the readers should be realized that these practical details are not limited to the present disclosure. That is, in some embodiments of the present disclosure, the practical details are not necessary. In addition, in order to simplify the figures, some of the conventional structures and elements will be shown in the figures with simplified schematic; and the repeated elements will be shown by the same reference numerals.

Please refer to FIG. 1, which is a flow chart of a method for analyzing electromagnetic characteristic 100 according to one embodiment of the present disclosure. The method for analyzing electromagnetic characteristic 100 is used to analyze an electromagnetic characteristic of an object collocating with a power transmitting element, and the method for analyzing electromagnetic characteristic 100 includes a step 110, a step 120 and a step 130.

In the step 110, an electromagnetic evaluation model establishing step is performed, which includes establishing an object unit, establishing a power transmitting unit and establishing a simulating unit. The object unit is an arbitrary geometry shape, and the object unit has an object information. The object information can be but not limited to an area information or a volume information. The power transmitting unit has an electromagnetic signal, and the power transmitting unit is used to simulate a vehicle antenna. The simulating unit is defined as at least one base point emitting a plurality of beams to form a plurality of projection points, and the projection points are used to simulate a plurality of metal dusts on the object unit. The object unit, the power transmitting unit and the simulating unit are combined to form an electromagnetic evaluation model, and the object unit is disposed between the power transmitting unit and the simulating unit. A projection point coverage rate of the electromagnetic evaluation model is obtained according to the object information and a sum of areas of the projection points, and the projection point coverage rate is a metal coverage rate of the metal dusts on the object unit.

In the step 120, an electromagnetic reference model is provided, wherein the object unit and the power transmitting unit are combined to form the electromagnetic reference model. Specifically, the difference between the electromagnetic reference model and the electromagnetic evaluation model is that the electromagnetic reference model does not include the simulating unit. The simulating unit is for simulating the metal dusts on the object unit, so that the object unit of the electromagnetic reference model does not include the metal dusts, and thus the electromagnetic reference model can be used as a reference value for the electromagnetic characteristic analysis.

In the step 130, a comparing step is performed, wherein a radiation pattern data of the electromagnetic reference model and a radiation pattern data of the electromagnetic evaluation model are obtained by the electromagnetic signal of the power transmitting unit, respectively, and the two radiation pattern data are compared to obtain an electromagnetic gain difference value. Specifically, an azimuth radiation pattern data and an elevation angle radiation pattern data are obtained in a horizontal direction and a vertical direction by the radiation pattern data, respectively. Furthermore, an electromagnetic gain value of the electromagnetic evaluation model and the electromagnetic reference model at a specific angle is obtained from the azimuth radiation pattern data or the elevation angle radiation pattern data. The difference between the electromagnetic gain value of the electromagnetic reference model and the electromagnetic gain value of the electromagnetic evaluation model at the specific angle is the electromagnetic gain difference value.

The aforementioned steps are performed in the electromagnetic simulation software. The electromagnetic simulation software of the present disclosure can be but not limited to IE3D, HFSS or CST. According to the aforementioned embodiment, the specific examples are provided below and described in detail with the drawings.

Figure 2B:
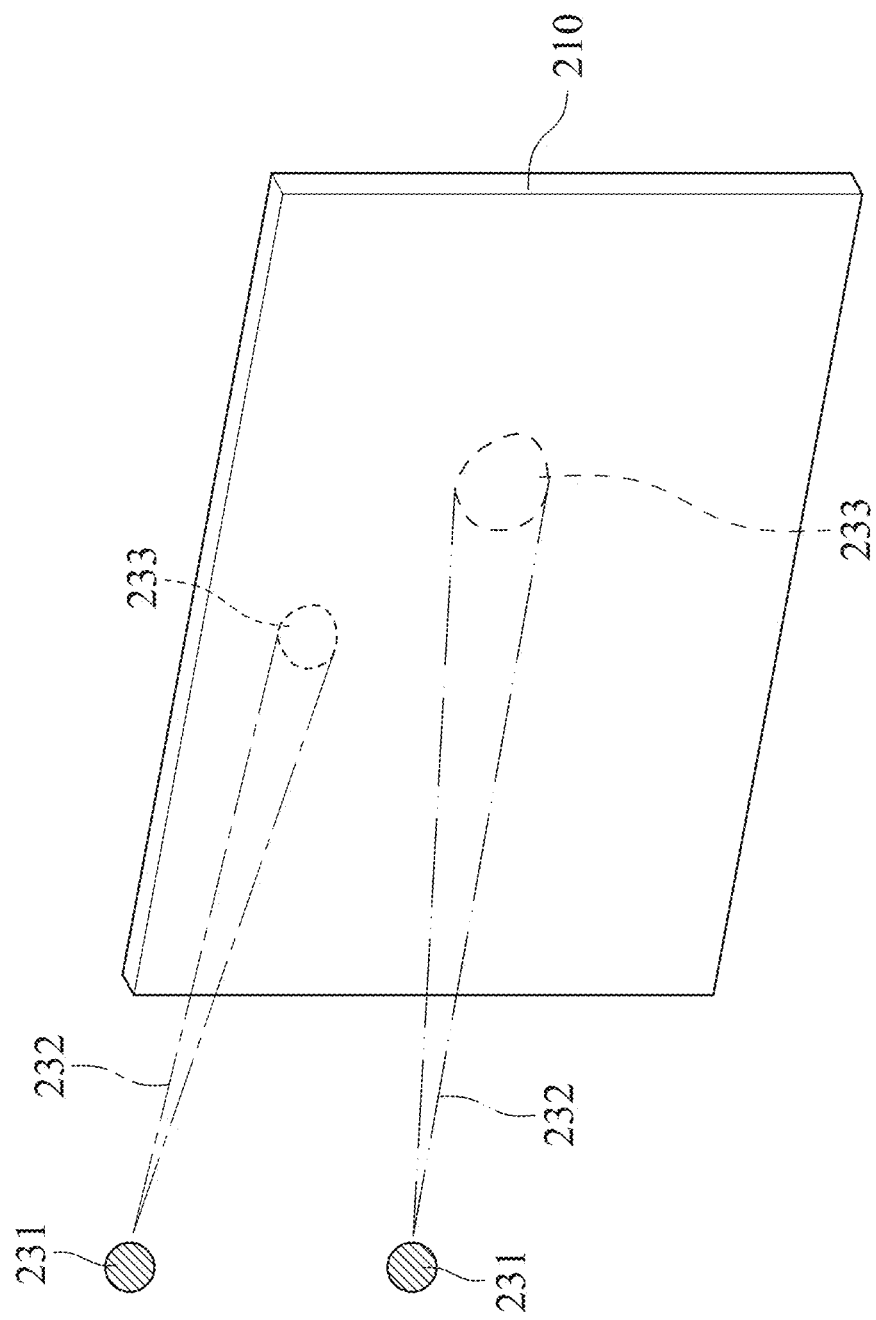
FIG. 2B is a schematic diagram of the simulating unit according to Example 1 of the present disclosure.
Figure 3A:
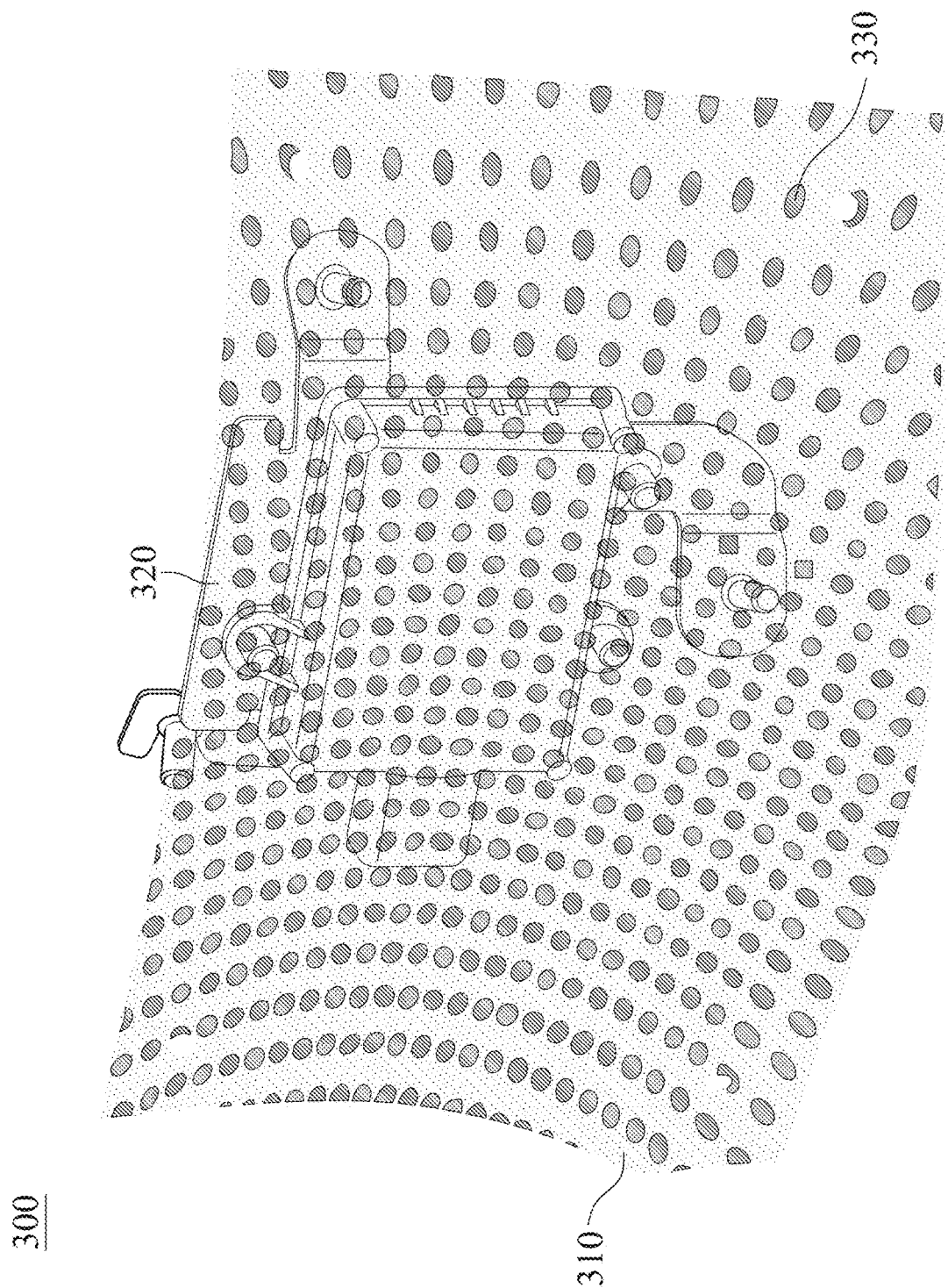
FIG. 3A is a schematic diagram of the electromagnetic evaluation model according to Example 2 of the present disclosure.
Figure 4A:
FIG. 4A is a schematic diagram of the electromagnetic evaluation model according to Example 3 of the present disclosure.

Please refer to FIGS. 2A, 3A and 4A, wherein FIG. 2A is a schematic diagram of the electromagnetic evaluation model 200 according to Example 1 of the present disclosure. FIG. 3A is a schematic diagram of the electromagnetic evaluation model 300 according to Example 2 of the present disclosure. FIG. 4A is a schematic diagram of the electromagnetic evaluation model 400 according to Example 3 of the present disclosure. The difference between Example 1 to Example 3 is the difference of the simulating unit. The simulating unit of the present disclosure is projecting to the object unit by the method of simulating the light source and light beam to obtain the projected area. The base point is assumed to the light source, the beam is assumed to the light beam, and the projection point of the base point emitting the beam to the object unit simulates the projection area of the light source emitting the light beam to the object unit. Therefore, the projection point is used to simulate the size and the distribution of metal dust on the object unit. Furthermore, Comparative Example 1 of the present disclosure is the electromagnetic reference model (not shown) without the simulating unit. The electromagnetic reference model can refer to the aforementioned paragraph, and will not be described herein.

In FIG. 2A, the electromagnetic evaluation model 200 of Example 1 includes an object unit 210, a power transmitting unit 220 and a simulating unit 230. The object unit 210 and the power transmitting unit 220 can refer to the aforementioned paragraph, and will not be described herein. However, please refer to FIG. 2B, which is a schematic diagram of the simulating unit 230 according to Example 1 of the present disclosure. The simulating unit 230 constructs at least one base point 231 first, and a number of the at least one base point 231 is at least two. One beam 232 emitted from each of the base points 231 is projected to the object unit 210 to form a plurality of projection points 233. In the electromagnetic evaluation model 200 of FIG. 2A, due to distances between any two of the beams (please refer to the beams 232 in FIG. 2B) emitted from the base points (please refer to the base points 231 in FIG. 2B) adjacent to each other are equal, and the beams are emitted in the direction of the object unit 210 in parallel with each other. Therefore, the formed projection points (please refer to the projection points 233 in FIG. 2B) do not overlap, and an arrangement of the projection points is defined as the object unit 210 has a uniform metal dust distribution.

Figure 3B:
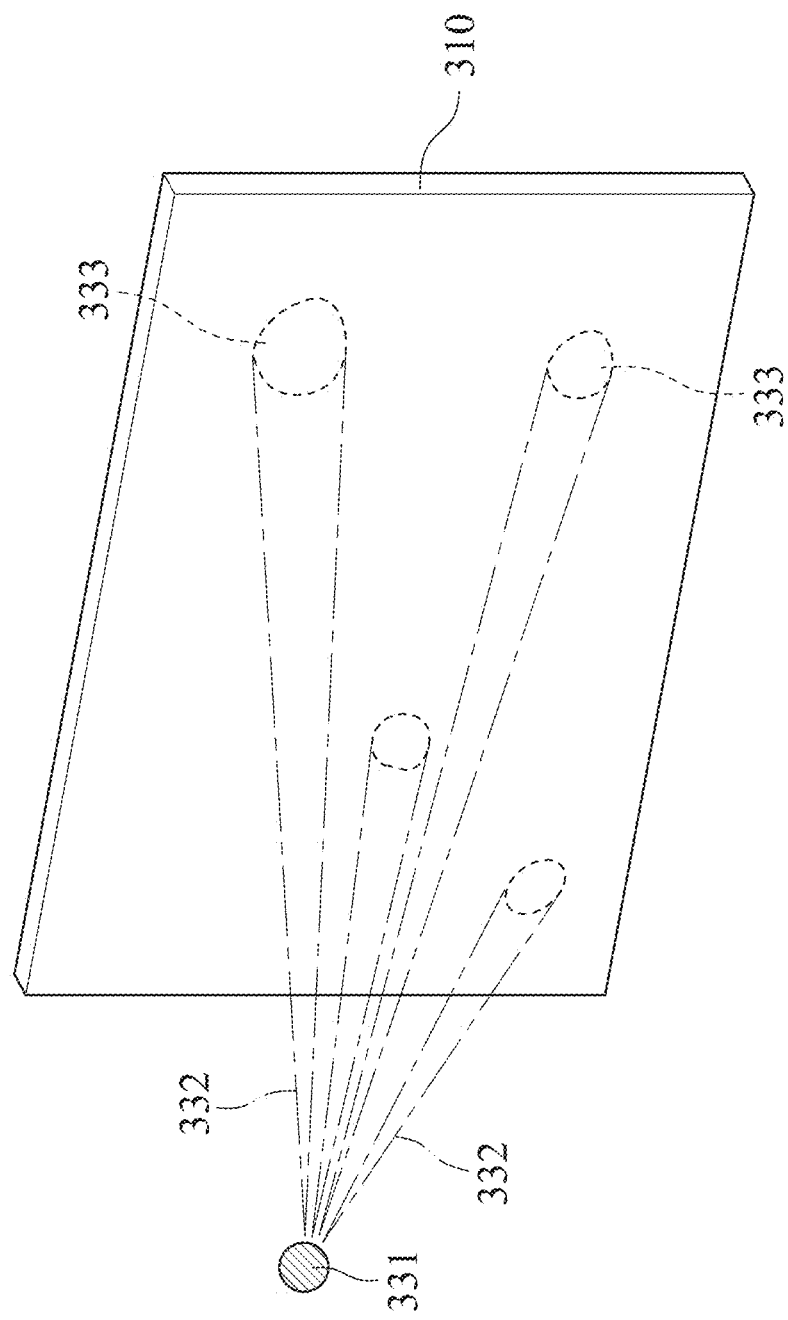
FIG. 3B is a schematic diagram of the simulating unit according to Example 2 of the present disclosure.

In FIG. 3A, the electromagnetic evaluation model 300 of Example 2 includes an object unit 310, a power transmitting unit 320 and a simulating unit 330. The object unit 310 and the power transmitting unit 320 can refer to the aforementioned paragraph, and will not be described herein. However, please refer to FIG. 3B, which is a schematic diagram of the simulating unit 330 according to Example 2 of the present disclosure. The simulating unit 330 constructs at least one base point 331 first. A plurality of beams 332 emitted from the base point 331 is projected to the object unit 310 to form a plurality of projection points 333. In the electromagnetic evaluation model 300 of FIG. 3A, a cut plane (for example, a plane on the object unit 310) is provided at a predetermined distance between the beams (please refer to the beams 332 in FIG. 3B) and the base point (please refer to the base point 331 in FIG. 3B), the base point is located on a normal line perpendicular to the cut plane, and on the cut plane, distances between any two of the beams emitted from the base point adjacent to each other are equal, and thus when the beams emitted from the base point to the object unit 310 in any direction, the formed projection points (please refer to the projection points 333 in FIG. 3B) do not overlap, and an arrangement of the projection points is defined as the object unit 310 has a regular metal dust distribution. Specifically, the difference between Example 1 and Example 2 is that the base point of Example 2 is only one, which emits the beams in any direction. However, the number of the base point of Example 1 is at least two, which emit the beams in a horizontal direction. Therefore, the projection points of Example 2 are denser at the position close to the base point and sparse at the position away from the base point, so that the object unit 310 of Example 2 is not uniform distribution.

Figure 4B:
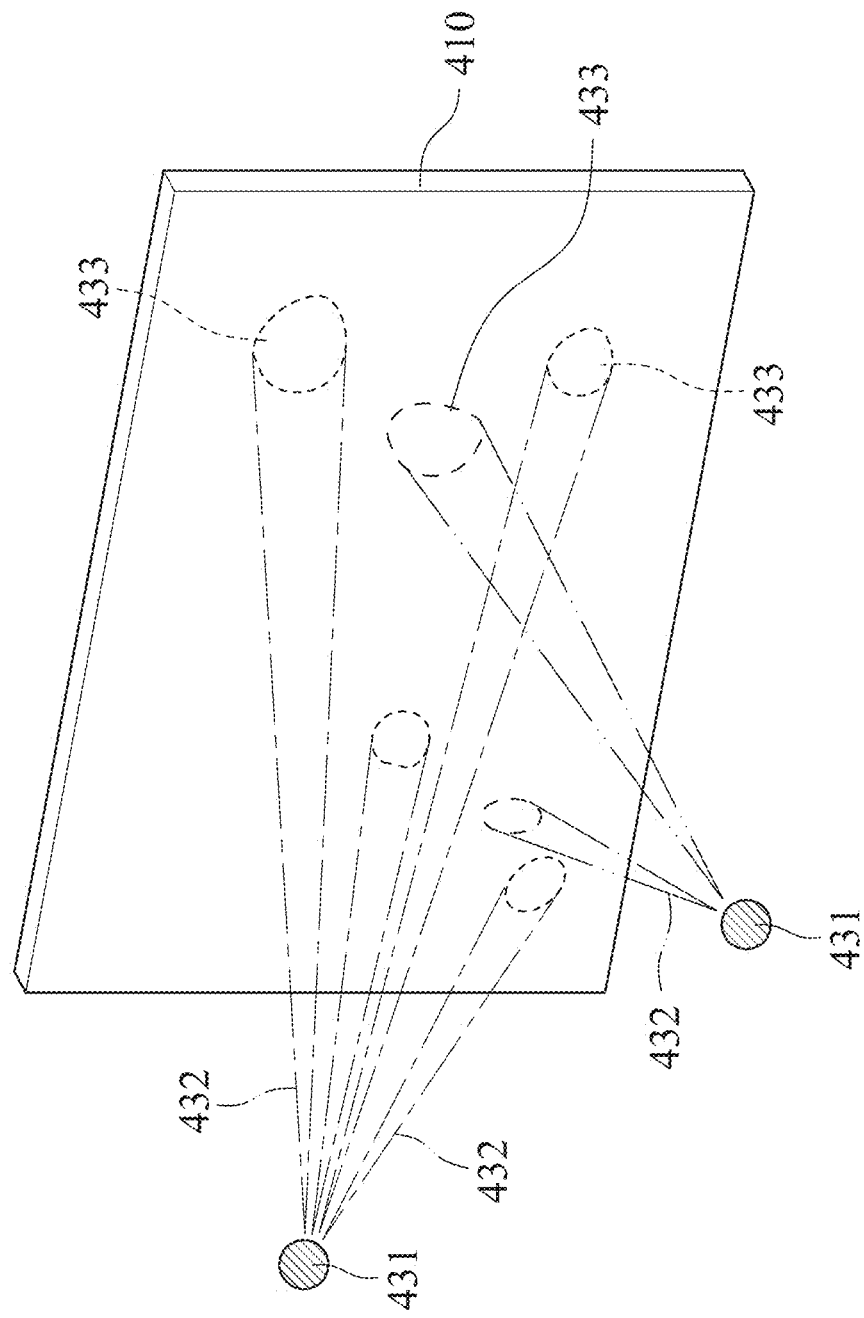
FIG. 4B is a schematic diagram of the simulating unit according to Example 3 of the present disclosure.

In FIG. 4A, the electromagnetic evaluation model 400 of Example 3 includes an object unit 410, a power transmitting unit 420 and a simulating unit 430. The object unit 410 and the power transmitting unit 420 can refer to the aforementioned paragraph, and will not be described herein. Please refer to FIG. 4B, which is a schematic diagram of the simulating unit 430 according to Example 3 of the present disclosure. The simulating unit 430 constructs at least one base point 431 first, and a number of the at least one base point 431 is at least two. A plurality of beams 432 emitted from each of the base points 431 is projected to the object unit 410 to form a plurality of projection points 433. In the electromagnetic evaluation model 400 of FIG. 4A, due to distances between any two of the beams (please refer to the beams 432 in FIG. 4B) emitted from the base points (please refer to the base points 431 in FIG. 4B) adjacent to each other are not equal, and a distance between the base points and the surface normal of the object unit 410 is also not equal. Therefore, there will be overlapped projection points (please refer to the projection points 433 in FIG. 4B) and non-overlapped projection points, so that an arrangement of the projection points is defined as the object unit 410 has a random metal dust distribution.

The areas of the object units of Example 1 to Example 3 and Comparative Example 1 are 37088 $mm^2$, and the sum of areas of the projection points is about 5560 $mm^2$. Therefore, the projection point coverage rate of Example 1 to Example 3 is 10% to 20%. The projection point coverage rate is used to simulate the metal coverage rate of the metal dust on the object unit, so that the metal coverage rate of Example 1 to Example 3 can be assumed to 10% to 20%.

Figure 5A:
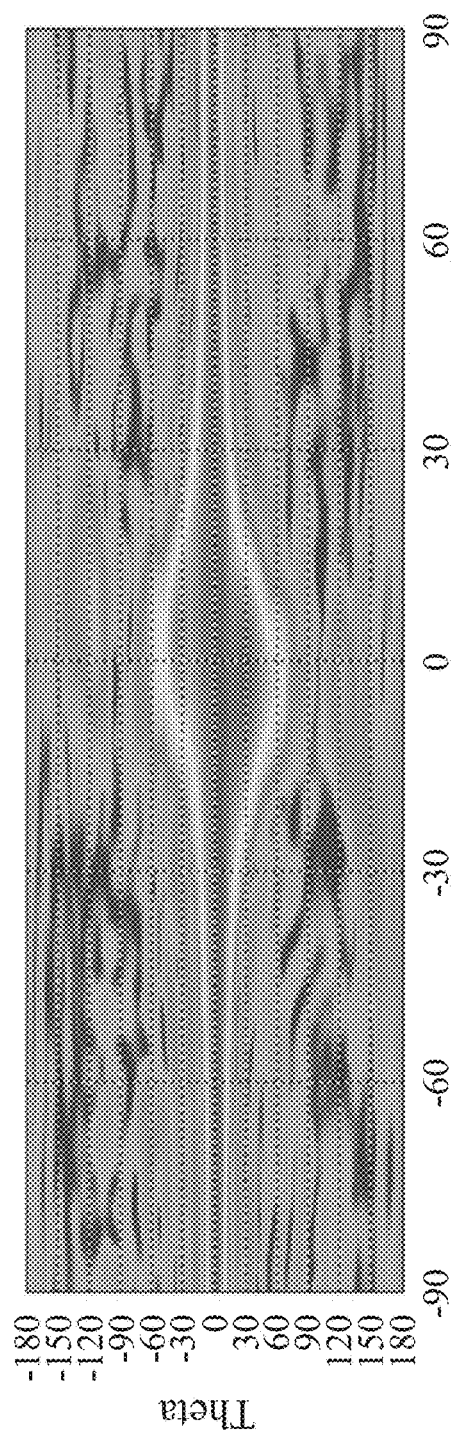
FIG. 5A is a radiation pattern according to Comparative Example 1 of the present disclosure.
Figure 5B:
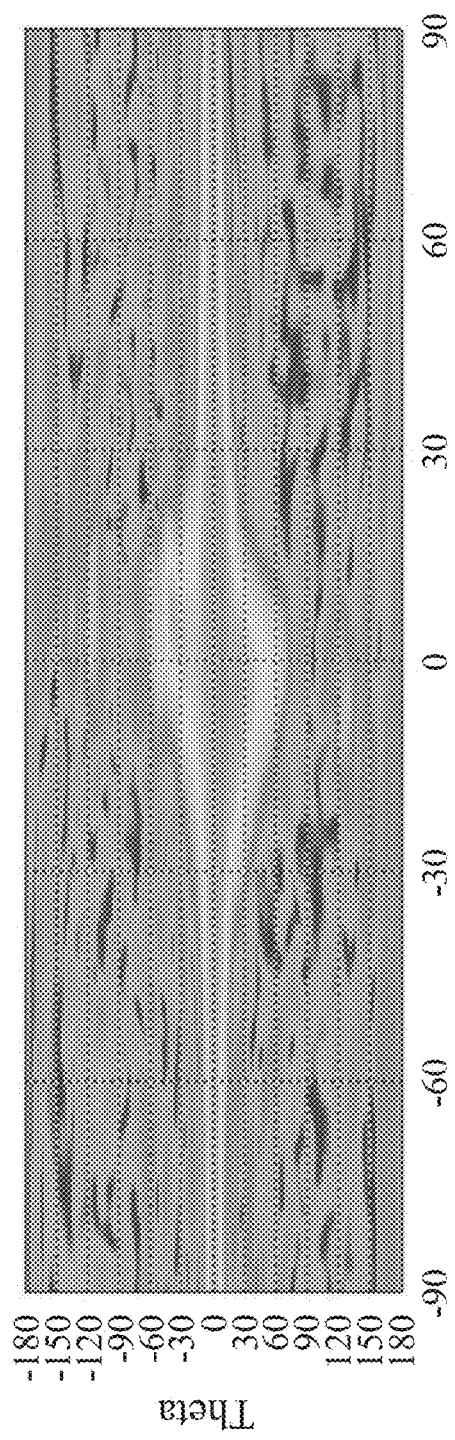
FIG. 5B is a radiation pattern diagram according to Example 1 of the present disclosure.
Figure 5C:
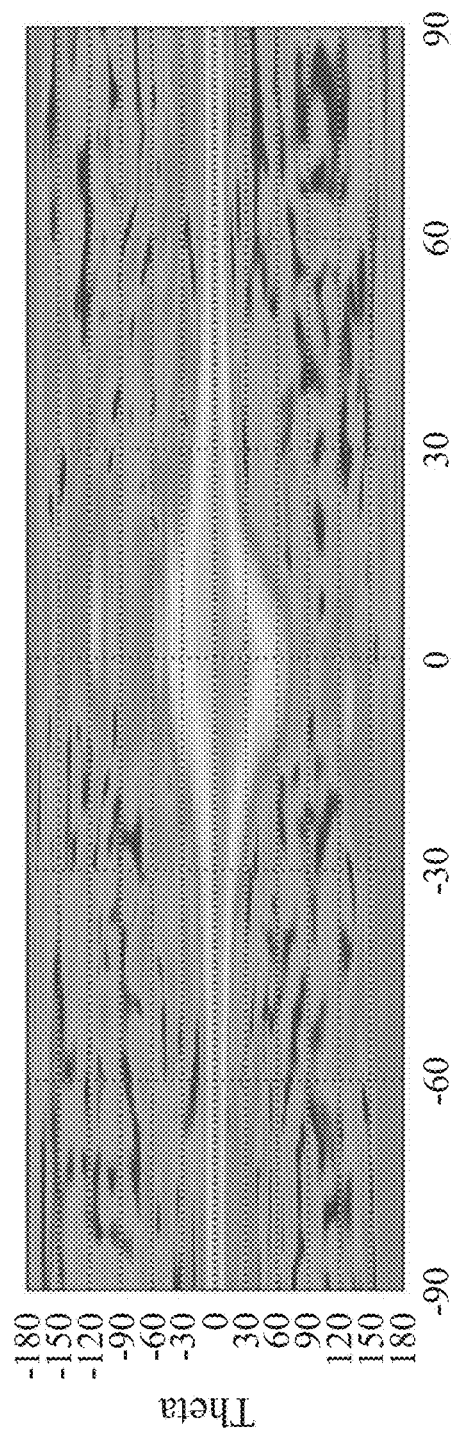
FIG. 5C is a radiation pattern diagram according to Example 2 of the present disclosure.
Figure 5D:
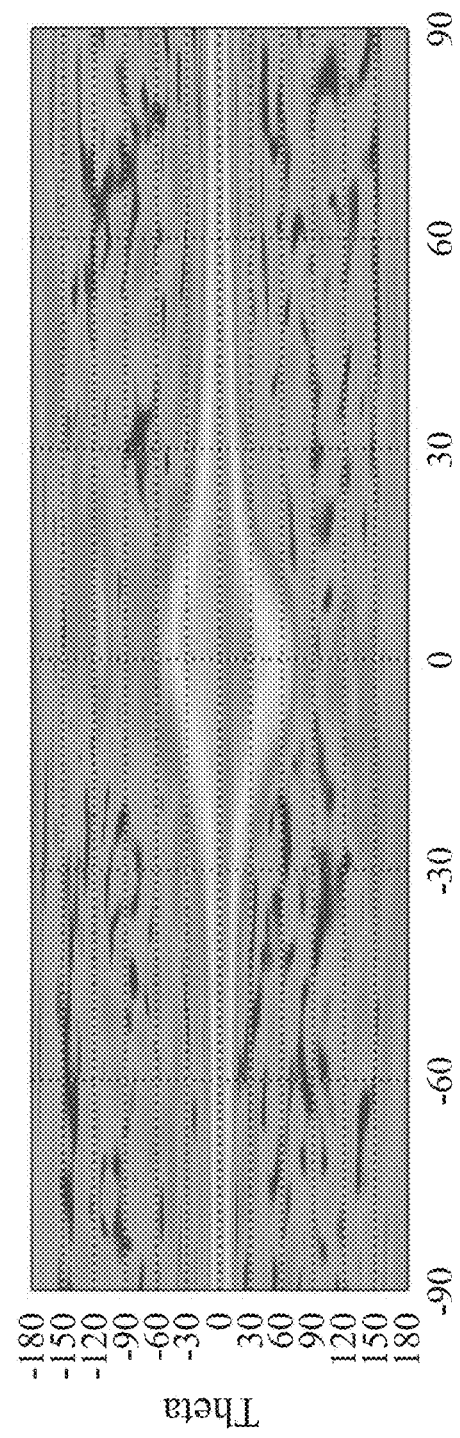
FIG. 5D is a radiation pattern diagram according to Example 3 of the present disclosure.

Please refer to FIGS. 5A, 5B, 5C and 5D, wherein FIG. 5A is a radiation pattern according to Comparative Example 1 of the present disclosure. FIG. 5B is a radiation pattern diagram according to Example 1 of the present disclosure. FIG. 5C is a radiation pattern diagram according to Example 2 of the present disclosure. FIG. 5D is a radiation pattern diagram according to Example 3 of the present disclosure. It can be observed that the change caused by the influence of metal dust at the specific angle in FIGS. 5A to 5D. Due to the energy of the main lobe is reflected by the influence of metal dust, the phenomenon of energy climbing can be seen in both the lateral side (±90 degrees) and the rear side (±180 degrees) of the main lobe.

Figure 6A:
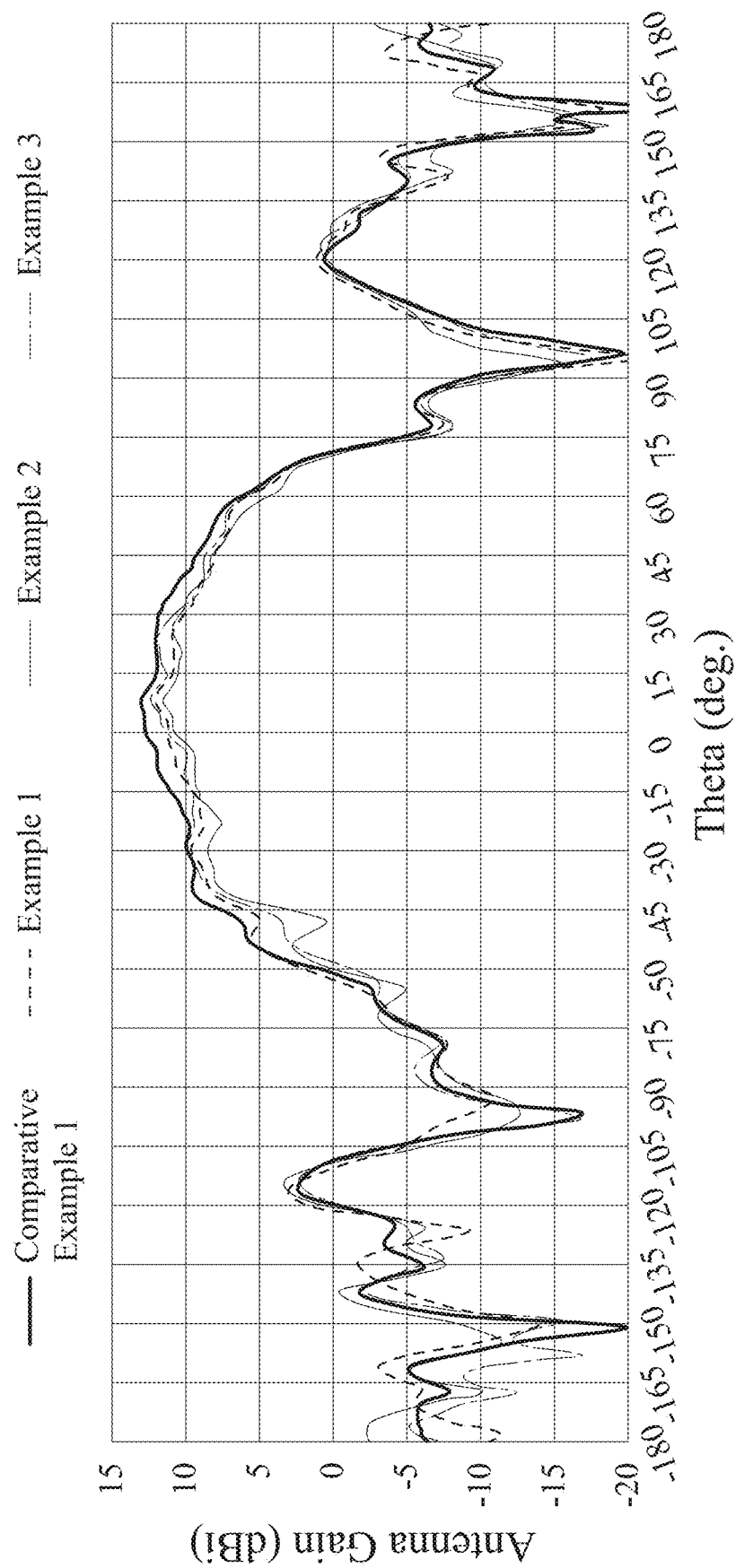
FIG. 6A is an azimuth radiation pattern diagram according to Comparative Example 1, Example 1 to Example 3 of the present disclosure.
Figure 6B:
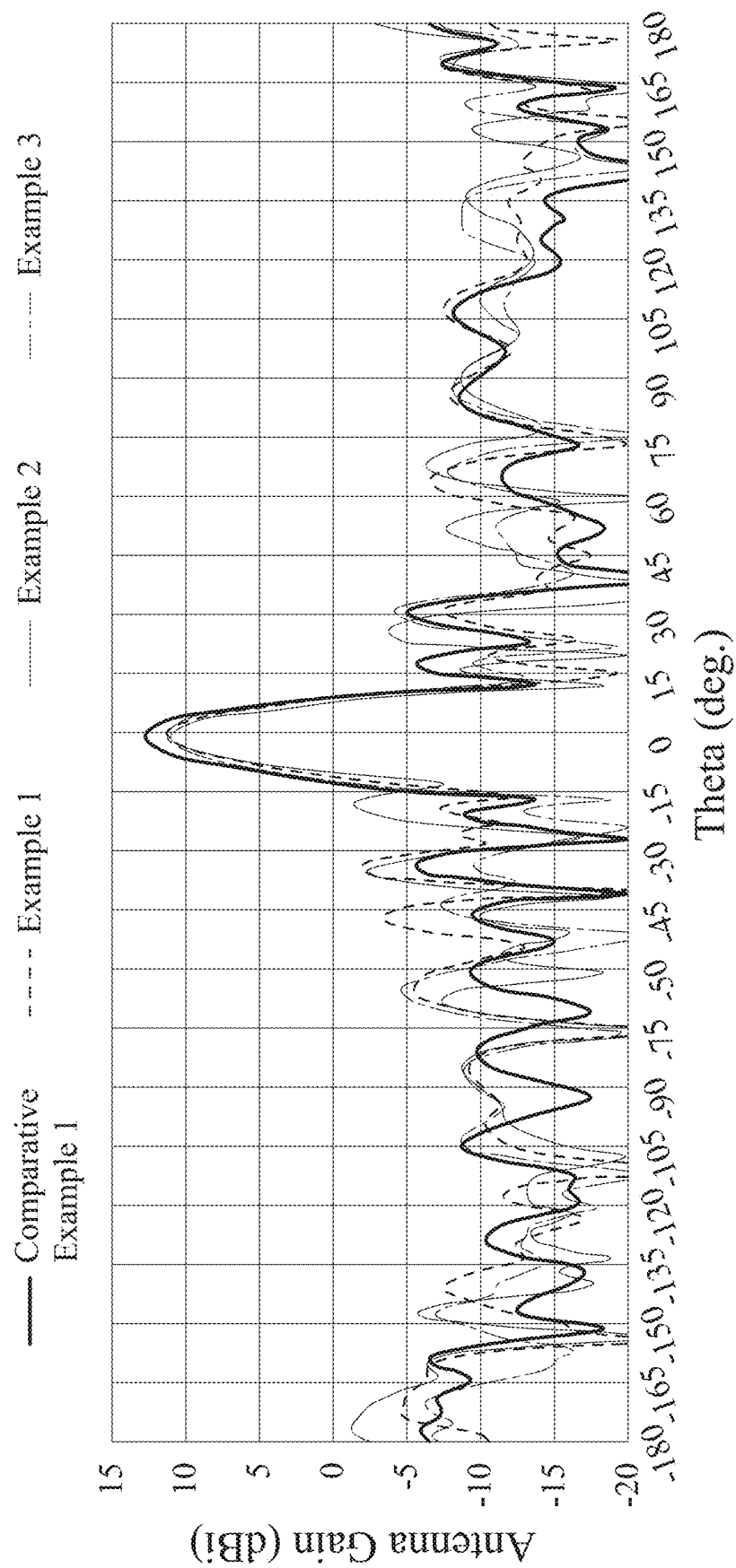
FIG. 6B is an elevation angle radiation pattern diagram according to Comparative Example 1, Example 1 to Example 3 of the present disclosure.

Furthermore, in the radiation pattern diagram of FIGS. 5A to 5D, the azimuth radiation pattern data and the elevation angle radiation pattern data are obtained in the horizontal direction and the vertical direction, respectively. Please refer to FIG. 6A and FIG. 6B, wherein FIG. 6A is an azimuth radiation pattern diagram according to Comparative Example 1, Example 1 to Example 3 of the present disclosure. FIG. 6B is an elevation angle radiation pattern diagram according to Comparative Example 1, Example 1 to Example 3 of the present disclosure.

As known in FIG. 6A and FIG. 6B, when the metal coverage rate of Example 1 to Example 3 is 10% to 20%, the overall electromagnetic gain is in front of the power transmitting unit (Theta=0 degrees). In FIG. 6A, when the power transmitting unit at the Theta is 0 degrees position, the electromagnetic gain difference value between Comparative Example 1 and Example 1 to Example 3 is 1.0 dBi to 2.0 dBi. It is indicated that if the vehicle antenna is disposed in front of the vehicle bumper, which has the metal coverage rate of 10% to 20%, the electromagnetic characteristic of the vehicle antenna is decayed by 1.0 dB to 2.0 dB.

Furthermore, when the power transmitting unit at the Theta is −45 degrees position, the electromagnetic gain difference value between Comparative Example 1 and Example 1 to Example 3 is 1.5 dBi to 5.0 dBi. The reason for the large difference is that apart from the difference in the distribution of the metal dust, it may be the distance between the metal dust and the power transmitting unit is relatively close, so is more sensitive. However, when the power transmitting unit at the Theta is +45 degrees position, the electromagnetic gain difference value between Comparative Example 1 and Example 1 to Example 3 is 0.5 dBi to 1.5 dBi. It may be due to the distance between the metal dust and the power transmitting unit is relatively far, so the relative attenuation range is more consistent.

The results of the electromagnetic gain value and the electromagnetic gain difference value at the specific angle of Comparative Example 1 and Example 1 to Example 3 are shown in Table 1 to Table 3.

TABLE 1

| | Electromagnetic gain value (Theta = 0 degrees) | Electromagnetic gain difference value (Theta = 0 degrees) |
|---|---|---|
| Comparative Example 1 | 12.7 dBi | N/A |
| Example 1 | 11.3 dBi | 1.4 dBi |
| Example 2 | 10.8 dBi | 1.9 dBi |
| Example 3 | 11.3 dBi | 1.4 dBi |

TABLE 2

| | Electromagnetic gain value (Theta = −45 degrees) | Electromagnetic gain difference value (Theta = −45 degrees) |
|---|---|---|
| Comparative Example 1 | 7.5 dBi | N/A |
| Example 1 | 5.8 dBi | 1.7 dBi |
| Example 2 | 2.9 dBi | 4.6 dBi |
| Example 3 | 4.9 dBi | 2.6 dBi |

TABLE 3

| | Electromagnetic gain value (Theta = +45 degrees) | Electromagnetic gain difference value (Theta = +45 degrees) |
|---|---|---|
| Comparative Example 1 | 9.3 dBi | N/A |
| Example 1 | 8.0 dBi | 1.3 dBi |
| Example 2 | 8.2 dBi | 1.1 dBi |
| Example 3 | 8.6 dBi | 0.7 dBi |

The present disclosure utilizes to construct the different projection point distributions to simulate the distribution of the metal dust on the object unit. As known in Table 1 to Table 3, the presence of the metal dust distribution and the difference of the distribution location of Comparative Example 1 and Example 1 to Example 3 will cause the different characteristics appeared at the specific angle. Furthermore, when the electromagnetic gain difference value is less than a predetermined value, for example 4.0 dBi, as prejudging whether the installation position between the vehicle bumper and the vehicle antenna has the problem of excessive gain attenuation at the specific angle.

In the application, the distance between the vehicle antenna and the vehicle bumper can be a multiple of one-half the wavelength of the vehicle antenna. The vehicle antenna can be but not limited to an array antenna. The vehicle bumper is made of the plastic material, which can be but not limited to Polypropylene (PP), Polyetherimide (PEI), ABS resin or the mixture of Polycarbonate (PC) and Polyethylene terephthalate (PET). Then, the method for analyzing electromagnetic characteristic of the present disclosure is used to adjust the metal dust content in the vehicle bumper or the installation position of the vehicle antenna and the vehicle bumper, so that the electromagnetic gain value of the vehicle antenna can meet the specifications.

Figure 7:
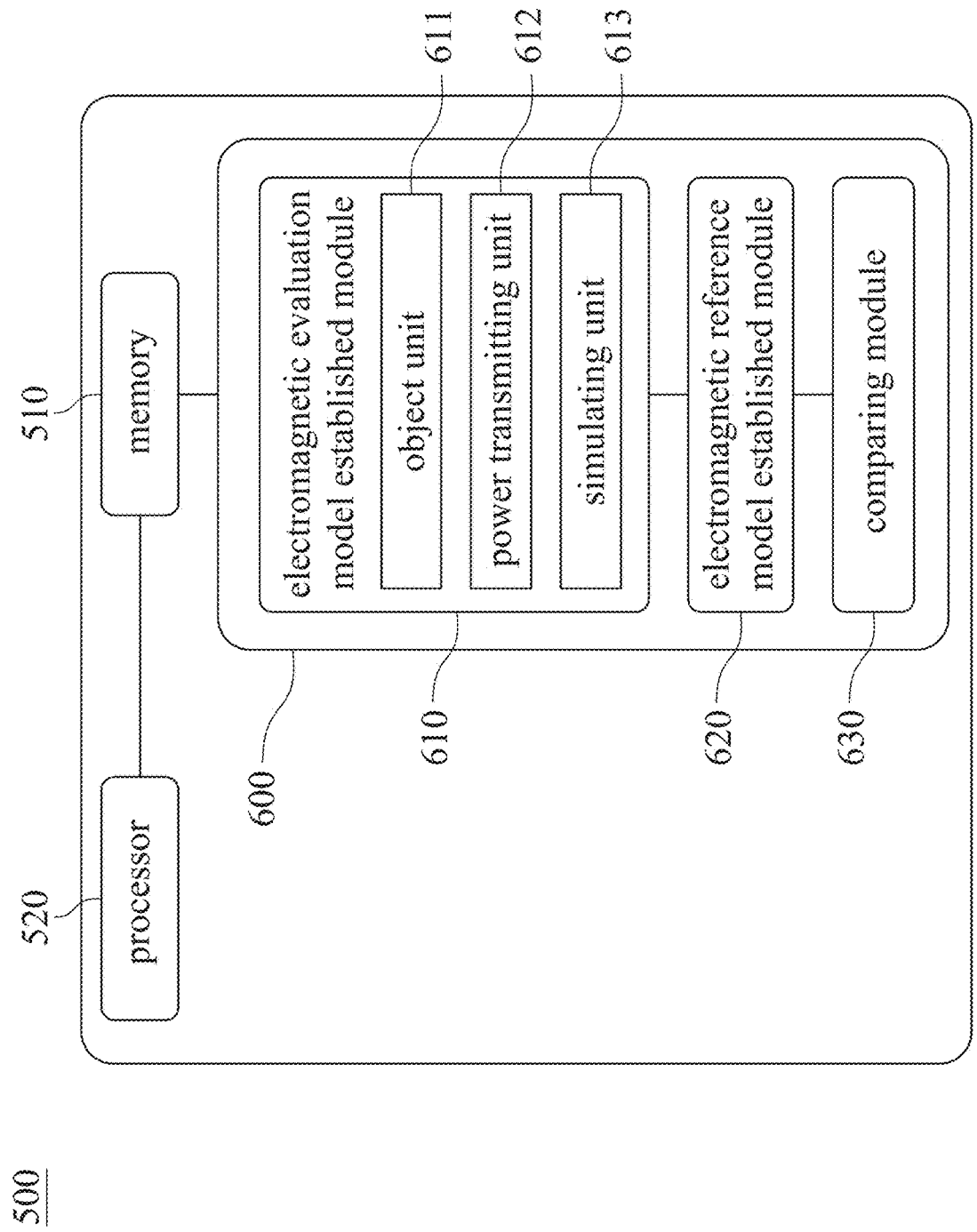
FIG. 7 is a block diagram of an electronic device according to another embodiment of the present disclosure.

Please refer to FIG. 7, which is a block diagram of an electronic device 500 according to another embodiment of the present disclosure. The electronic device 500 includes a memory 510 and a processor 520. The memory 510 stores an electromagnetic characteristic evaluation program 600, and the processor 520 is coupled to the memory 510 for executing the electromagnetic characteristic evaluation program 600. The electromagnetic characteristic evaluation program 600 includes an electromagnetic evaluation model established module 610, an electromagnetic reference model established module 620 and a comparing module 630.

Specifically, the electromagnetic evaluation model established module 610 includes an object unit 611, a power transmitting unit 612 and a simulating unit 613. The object unit 611 is an arbitrary geometry shape, and the object unit 611 has an object information. The object information can be but not limited to an area information or a volume information. The power transmitting unit 612 has an electromagnetic signal. The simulating unit 613 is defined as at least one base point emitting a plurality of beams to form a plurality of projection points, and the projection points are used to simulate a plurality of metal dusts on the object unit 611. The object unit 611, the power transmitting unit 612 and the simulating unit 613 are combined to form an electromagnetic evaluation model, and the object unit 611 is disposed between the power transmitting unit 612 and the simulating unit 613. A projection point coverage rate of the electromagnetic evaluation model is obtained according to the object information and the sum of areas of the projection points, and the projection point coverage rate is a metal coverage rate of the metal dusts on the object unit 611.

Furthermore, the simulating unit 613 can obtain different arranged projection points according to different number of the base points and beams to define the metal dust distribution of the object unit 611. The embodiment of the simulating unit 613 can be referred to FIG. 2A to FIG. 4B, and will not be described herein.

The electromagnetic reference model established module 620 is for combining the object unit 611 and the power transmitting unit 612 to obtain an electromagnetic reference model. The electromagnetic reference model established module 620 can refer to the aforementioned paragraph, and will not be described herein.

The comparing module 630 obtains a radiation pattern data of the electromagnetic reference model and a radiation pattern data of the electromagnetic evaluation model by the electromagnetic signal, respectively, and the two radiation pattern data are compared to obtain an electromagnetic gain difference value. Specifically, an azimuth radiation pattern data and an elevation angle radiation pattern data are obtained in a horizontal direction and a vertical direction by the radiation pattern data, respectively. Furthermore, an electromagnetic gain value of the electromagnetic evaluation model and the electromagnetic reference model at a specific angle is obtained from the azimuth radiation pattern data or the elevation angle radiation pattern data. The difference between the electromagnetic gain value of the electromagnetic reference model and the electromagnetic gain value of the electromagnetic evaluation model at the specific angle is the electromagnetic gain difference value.

In other embodiments, the azimuth radiation pattern data or the elevation angle radiation pattern data can also be obtained, for example, using only the azimuth radiation pattern data to obtain the electromagnetic gain values of the electromagnetic evaluation model and the electromagnetic reference model at the specific angle. The difference between the electromagnetic gain value of the electromagnetic reference model and the electromagnetic gain value of the electromagnetic evaluation model at the specific angle is the electromagnetic gain difference value.

Furthermore, the electromagnetic characteristic evaluation program 600 can further include an evaluating module (not shown), which is for evaluating whether the electromagnetic gain difference value between the electromagnetic evaluation model and the electromagnetic reference model at the specific angle is less than a predetermined value.

In conclusion, the method for analyzing electromagnetic characteristic and the electronic device of the present disclosure can construct the objects with different metal dust distributions by the electromagnetic simulation software to simulate and analyze the degree of the electromagnetic gain attenuation between the vehicle bumper and the vehicle antenna. Then, regulating the acceptable metal composition or prejudges the location where may occurs the problem in the application, so as to reduce the cost of multiple verifications and the development time between the vehicle antenna and the vehicle bumper.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for analyzing electromagnetic characteristic, which is used to analyze an electromagnetic characteristic of an object coated with a plurality of metal dusts collocating with a power transmitting element, and the method for analyzing electromagnetic characteristic comprising:
   performing an electromagnetic evaluation model establishing step, comprising:
      establishing an object unit, wherein the object unit is an arbitrary geometry shape, and the object unit has an object information;
      establishing a power transmitting unit, wherein the power transmitting unit has an electromagnetic signal; and
      establishing a simulating unit, wherein the simulating unit is defined as at least one base point emitting a plurality of beams to form a plurality of projection points, and the projection points are used to simulate the metal dusts on the object unit;
   wherein, the object unit, the power transmitting unit and the simulating unit are combined to form the electromagnetic evaluation model, a projection point coverage rate of the electromagnetic evaluation model is obtained according to the object information and a sum of areas of the projection points, and the projection point coverage rate is a metal coverage rate of the metal dusts on the object unit;
   providing an electromagnetic reference model, wherein the object unit and the power transmitting unit are combined to form the electromagnetic reference model;
   performing a comparing step, wherein a radiation pattern data of the electromagnetic reference model and a radiation pattern data of the electromagnetic evaluation model are obtained by the electromagnetic signal, respectively, and the two radiation pattern data are compared to obtain an electromagnetic gain difference value; and
   adjusting a composition of the metal dusts or a position of the power transmitting unit based on the electromagnetic gain difference value to meet a requirement of an installation.

2. The method for analyzing electromagnetic characteristic of claim 1, wherein the object information is an area information or a volume information.

3. The method for analyzing electromagnetic characteristic of claim 1, wherein in the simulating unit, a number of the at least one base point is at least two, and each of the base points emits the one beam to form the projection points.

4. The method for analyzing electromagnetic characteristic of claim 3, wherein in the electromagnetic evaluation model, distances between any two of the beams adjacent to each other are equal, and an arrangement of the projection points is defined as the object unit has a uniform metal dust distribution.

5. The method for analyzing electromagnetic characteristic of claim 1, wherein in the simulating unit, the at least one base point emits the beams to form the projection points.

6. The method for analyzing electromagnetic characteristic of claim 5, wherein in the electromagnetic evaluation model, a cut plane is provided at a predetermined distance between the beams and the at least one base point, the at least one base point is located on a normal line perpendicular to the cut plane, and on the cut plane, distances between any two of the beams adjacent to each other are equal, and an arrangement of the projection points is defined as the object unit has a regular metal dust distribution.

7. The method for analyzing electromagnetic characteristic of claim 1, wherein in the simulating unit, a number of the at least one base point is at least two, and each of the base points emits the beams to form the projection points.

8. The method for analyzing electromagnetic characteristic of claim 7, wherein in the electromagnetic evaluation model, distances between any two of the beams adjacent to each other are not equal, and an arrangement of the projection points is defined as the object unit has a random metal dust distribution.

9. The method for analyzing electromagnetic characteristic of claim 1, wherein an azimuth radiation pattern data and an elevation angle radiation pattern data are obtained in a horizontal direction and a vertical direction by the radiation pattern data, respectively.

10. The method for analyzing electromagnetic characteristic of claim 9, wherein an electromagnetic gain value of the electromagnetic evaluation model and the electromagnetic reference model at a specific angle is obtained from the azimuth radiation pattern data or the elevation angle radiation pattern data.

11. The method for analyzing electromagnetic characteristic of claim 10, further comprising:
   evaluating whether the electromagnetic gain difference value between the electromagnetic evaluation model and the electromagnetic reference model at the specific angle is less than a predetermined value.

12. An electronic device, comprising:
   a memory storing an electromagnetic characteristic evaluation program, which is used to evaluate an electromagnetic characteristic of an object unit coated with a plurality of metal dusts collocating with a power transmitting unit; and
   a processor coupled to the memory for executing the electromagnetic characteristic evaluation program;
   wherein the electromagnetic characteristic evaluation program comprises:
      an electromagnetic evaluation model established module comprising:
         the object unit, wherein the object unit is an arbitrary geometry shape, and the object unit has an object information;

the power transmitting unit, wherein the power transmitting unit has an electromagnetic signal; and a simulating unit, wherein the simulating unit is defined as at least one base point emitting a plurality of beams to form a plurality of projection points, and the projection points are used to simulate the metal dusts on the object unit;

wherein, the object unit, the power transmitting unit and the simulating unit are combined to form an electromagnetic evaluation model, a projection point coverage rate of the electromagnetic evaluation model is obtained according to the object information and a sum of areas of the projection points, and the projection point coverage rate is a metal coverage rate of the metal dusts on the object unit;

an electromagnetic reference model established module for combining the object unit and the power transmitting unit to obtain an electromagnetic reference model; and a comparing module, wherein a radiation pattern data of the electromagnetic reference model and a radiation pattern data of the electromagnetic evaluation model are obtained by the electromagnetic signal, respectively, and the two radiation pattern data are compared to obtain an electromagnetic gain difference value, so that a composition of the metal dusts or a position of the power transmitting unit based on the electromagnetic gain difference value to meet a requirement of an installation is adjusted.

13. The electronic device of claim 12, wherein the object information is an area information or a volume information.

14. The electronic device of claim 12, wherein:

in the simulating unit, a number of the at least one base point is at least two, and each of the base points emits the one beam to form the projection points; and in the electromagnetic evaluation model, distances between any two of the beams adjacent to each other are equal, and an arrangement of the projection points is defined as the object unit has a uniform metal dust distribution.

15. The electronic device of claim 12, wherein:

in the simulating unit, the at least one base point emits the beams to form the projection points; and in the electromagnetic evaluation model, a cut plane is provided at a predetermined distance between the beams and the at least one base point, the at least one base point is located on a normal line perpendicular to the cut plane, and on the cut plane, distances between any two of the beams adjacent to each other are equal, and an arrangement of the projection points is defined as the object unit has a regular metal dust distribution.

16. The electronic device of claim 12, wherein:

in the simulating unit, a number of the at least one base point is at least two, and each of the base points emits the beams to form the projection points; and in the electromagnetic evaluation model, distances between any two of the beams adjacent to each other are not equal, and an arrangement of the projection points is defined as the object unit has a random metal dust distribution.

17. The electronic device of claim 12, wherein an azimuth radiation pattern data and an elevation angle radiation pattern data are obtained in a horizontal direction and a vertical direction by the radiation pattern data, respectively.

18. The electronic device of claim 17, wherein an electromagnetic gain value of the electromagnetic evaluation model and the electromagnetic reference model at a specific angle is obtained from the azimuth radiation pattern data or the elevation angle radiation pattern data.

19. The electronic device of claim 18, wherein the electromagnetic characteristic evaluation program further comprises:

an evaluating module, wherein the evaluating module is for evaluating whether the electromagnetic gain difference value between the electromagnetic evaluation model and the electromagnetic reference model at the specific angle is less than a predetermined value.

* * * * *